US005401358A

United States Patent [19]
Kadomura

[11] Patent Number: 5,401,358
[45] Date of Patent: Mar. 28, 1995

[54] DRY ETCHING METHOD

[75] Inventor: Shingo Kadomura, Kanagawa, Japan

[73] Assignee: Sony Corporation, Tokyo, Japan

[21] Appl. No.: 859,342

[22] Filed: Mar. 30, 1992

[30] Foreign Application Priority Data

Mar. 29, 1991 [JP] Japan .................................. 3-091542

[51] Int. Cl.⁶ ............................................ H01L 21/00
[52] U.S. Cl. .................... 156/651; 156/662; 156/643; 156/646; 156/653
[58] Field of Search ............... 156/643, 646, 662, 656, 156/651, 652, 653

[56] References Cited

FOREIGN PATENT DOCUMENTS 109706   5/1984   European Pat. Off. .
60-020516 2/1985  Japan .
61-248428 11/1986 Japan .

OTHER PUBLICATIONS

"Layer-By-Layer Controlled Digital Etching by Means of An Electron-Beam-Excited Plasma System'-',-Japaneese Journal of Appl. Physics; vol. 29, No. 10; 1990, pp. 2216-2219 Meguro et al.

"Neutral-Beam-Assisted Etching of SiO₂–A Charge-Free Etching Process"; Japaneese Journal Appl. Phys. 1; vol. 29, No. 10; 1990; pp. 2220-2222.

"Selective and Anisotropic Reactive Ion Etch of LPCVD Silicon Nitride with CHF₃ Based Gases"; J. Vac. Sci. Tech. B2(4); Oct. 84'; Mele et al.

"The Role of Chemisorption In Plasma Etching"; Winters; J. App. Phys. 49(10); pp. 5165-5170; 1978.

"Surface Studies of And A Mass Balance Model For Ar⁺ Ion-Assisted Cl₂ Etching of Si"; J. Vac. Sci. B1(1); Jan. 1983; pp. 37-42.

"Digital Chemical Vapor Deposition And Etching Technologies For Semiconductor Processing"; Horiike et al.; 1990; J. Vac. Sci. Tech. A; 8(3)-1; pp. 1844-1850.

"Atomic Layer Controlled Digital Etching of Silicon"; Sakaue et al.,–Journal of Applied Physics; 29(11); pp. 2648-2652; Sakaue et al.; 1990.

"Lower Plasma-Induced Damage In SiO/Si at Lower Temperature"; Mizutani et al.; 1990; Appl. Phys. Lett 57(16); pp. 1654–1656.

"Highly Selective Etching of Silicon Nitride (Si₃N₄) to Silicon Dioxide Employing Fluorine and Chlorine Atoms Generated By Microwave Discharge"; Suto et al.; J. Electrochom. Soc., 136 (7); abstract only; 1989.

*Primary Examiner*—R. Bruce Breneman
*Assistant Examiner*—George Goudreau
*Attorney, Agent, or Firm*—Hill, Steadman & Simpson

[57] ABSTRACT

Proposed is a method for achieving an improved etchrate and exceedingly low damage in a so-called digital etching technique consisting of etching a sample wafer on the level of a monatomic layer. The present invention covers the following three main aspects, namely (a) formation of dangling bonds on the surface of a sample wafer and adsorption of etchants to the sample wafer for formation of a surface reaction layer, followed by elimination of the surface reaction layer by irradiation of a charged beam, (b) adsorption of etchants followed by formation and elimination of a surface reaction layer by neutral beam irradiation, and (c) formation of dangling bonds and adsorption of etchants to the sample wafer for formation of a surface reaction layer, followed by elimination of the surface reaction layer by irradiation of a neutral beam. With (a), high etchrate may be achieved because the wafer surface may be activated by the dangling bonds and the formation of the surface reaction layer may be promoted. With (b), although kinetic energies of the neutral beam is donated to the etchants, the effect by charges is nil, so that radiation damages may be avoided. With (c), the effects (a) and (b) are summed together so that high etchrate and low damages may be simultaneously achieved. Satisfactory results could be obtained on application of the present invention to etching of a single crystal silicon substrate and selective etching of an SiO₂/SiN$_x$ system.

2 Claims, 7 Drawing Sheets

DRY ETCHING METHOD

BACKGROUND OF THE INVENTION

1. Field of the Invention

This invention relates to a dry etching method applied to the preparation of semiconductor devices, by means of which an improved etchrate and exceedingly low damages may be achieved.

2. Description of the Related Art

As may be exemplified by recent VLSIs or ULSIs, the design rule for semiconductor devices is reduced to the submicron level and investigations are conducted towards achieving a half micron or even a quarter micron level. Needless to say, it is the reactive ion etching (RIE) taking advantage of directivity of ions in a plasma which has played the leading role in the art of such fine processing.

However, since etching proceeds in RIE by a mechanism in which accelerated reactive ions are impinged against a substrate to accelerate the reaction with active species, it is intrinsically difficult to achieve high underlying layer selectivity. On the other hand, collision of charged particles having certain kinetic energies leads to various radiation damages, such as generation of crystal defects in the silicon substrate or trapping of fixed charges or neutral trap in the oxide film. Besides, a mask charged to a negative potential in the plasma may lead to dielectric breakdown of thin oxide films, such as capacitor films or gate insulating films.

Recently, a technique of etching a layer at the level of a monaromic layer has been developed as an approach towards achieving low damages. This technique, publicized in e.g. Extended Abstracts of the 37th Spring Meeting (1990) of the Japan Society of Applied Physics and Related Societies, Vol.2, p.459, 28a-ZF-9 or in Digest of Papers 1990 3rd Microprocess Conference, B-5-1, is termed a digital etching. With this method, an etching gas is dissociated by microwave discharge in a first chamber and neutral active species generated in this manner are transported to a downstream manner so as to be adsorbed onto the surface of a sample wafer cooled previously to such a low temperature as not to cause spontaneous chemical reactions. The sample wafer is then transported to a second chamber where it is irradiated with an Ar+ beam having a necessary minimum amount of an energy of the order Of 20 eV for eliminating reaction products. Etching is performed on the level of a monaromic layer, with this sequence of operations of adsorption/reaction and elimination as one cycle, which cycle is repeated a predetermined number of times to achieve etching to a desired depth. Specifically, a process of etching a single crystal Si substrate using an $NF_3$ gas is introduced in the above publication. It is possible with this method to reduce ion impacts to the sample wafer to a markedly lower level than that achieved with conventional methods.

A neutral beam assisted etching has also been proposed as another approach towards reducing the damages. This is a technique disclosed in e.g. Extended Abstracts of the 51st Autumn Meeting (1990) of the Japan Society of Applied Physics, Vol.2, p.483, 27p-ZF-5 and Digest of Papers 1990 3rd Microprocess Conference B-5-3, and resides in neutralizing an ion beam of a lower energy of 200 to 700 eV derived from an ion source by a charge exchange reaction in a gaseous phase and employing the neutral beam for etching. This process, which is developed with an eye to the fact that the ion assisted reaction mechanism in a plasma etching mainly depends on kinetic energies of ions and hence charges of the ions are inherently unnecessary, is highly effective to avoid radiation damages by charged particles. Specifically, a process of etching an $SiO_2$ layer on an Si substrate while assisting the etching by neutral radicals generated in a $CHF_3$ plasma by a neutral Ar beam is introduced.

Despite these various approaches towards damage-free processes, a number of problems are left to be solved.

First, as regards the above mentioned digital etching, it was felt that fluorine radicals F* adsorbed on the surface of a cooled single crystal Si would react immediately with silicon to form a layer of reaction products composed of $SiF_x$. However, subsequent research, which was based on in situ XPS studies indicated that F* were hardly reacted with the single crystal Si substrate at lower temperatures and only physical adsorption and recombination of the radicals were produced while the layer of the reaction products was formed only as a result of ionic radiation. This finding is reported in Extended Abstracts of the 51st Autumn Meting (1990) of the Japan Society of Applied Physics, Vol.2, p.482, 27p-ZF-3. For this reason, it is intrinsically difficult to improve the etchrate significantly. Since it is necessary with digital etching to effect the cycle of adsorption, reaction and elimination tens to thousands of times to achieve the desired processing depth, the low etch rate in each process proves to be a hindrance to practical application of the digital etching.

Besides, since the reaction products are eliminated in conventional digital etching by irradiating charged particles, such as Ar+, the process is not completely damage-free. Even granting that a one-cycle operation is effected substantially damage-free, such cycle needs to be repeated a large number of times, so that damages are accumulated gradually until the effect of the damages may reach an unallowable level depending on process types.

On the other hand, the following problem is met in connection with the above mentioned neutral beam assisted etching. It is possible with this etching to prevent radiation damages by charged particles. However, since the kinetic energies of electrically neutral particles are utilized, the reaction mechanism is essentially the same as that of ion assisted etching, such as RIE, so that it is basically impossible to prevent lattice defects, for example, from being produced due to ion impacts.

OBJECT AND SUMMARY OF THE INVENTION

It is therefore an object of the present invention to provide a digital etching method whereby the etchrate may be improved and exceedingly low damage may be achieved.

In the course of our researches towards accomplishing the above object, the present inventor has directed attention to the fact that the layer of the reaction products was not formed immediately on the substrate by the neutral active species, which determined the process rate of the conventional techniques. Thus the present inventor has contemplated to form dangling bonds on the surface of a sample wafer to activate the wafer surface, so that the layer of the reaction products could be formed immediately. When etching the Si-based material by fluorine radicals F*, these radicals are easily bonded to the dangling bonds of Si to form Si—F covalent bonds to form an $SiF_x$ layer on the wafer surface. The fact that such bonds may be formed easily may be seen from the fact that hydrogen and fluorine have been used as effective terminating atoms in the preparation of e.g. amorphous silicon. Since the layer of the reaction products, which is the $SiF_x$ layer in the above example, may be then eliminated promptly by radiation of a charged beam, the etchrate may be improved significantly.

The present inventors have also contemplated utilizing neutral beam radiation for achieving exceedingly low damages in etching. Thus, in another aspect of the present invention, a sample is wafer cooled for adsorbing etchants onto the wafer surface and a neutral beam is radiated in place of the conventional ion beam, such as $Ar^+$, for the generation and elimination of the surface reaction layer. By the radiation with the neutral beam, the kinetic energies of the neutral beam are transferred to the neutral active species previously adsorbed on the wafer surface. The neutral active species make use of these energies as the activation energies necessary for the reactions with the sample wafer and as the energies the necessary for the elimination. Since the neutral beam is not charged, radiation damages, such as dielectric breakdown, are not produced.

By combining the formation of the dangling bonds with neutral beam radiation, high etchrate and exceedingly low damages may be achieved simultaneously. In still another aspect of the present invention, dangling bonds are previously produced on the wafer surface and neutral active species are adsorbed thereto for immediately forming a surface reaction layer, which layer is eliminated by the neutral beam without producing radiation damages. If the neutral active species are adsorbed without previously forming the dangling bonds, and the neutral beam is radiated subsequently as mentioned above, the kinetic energies are utilized for both the generation and elimination of the surface reaction layer. Conversely, if the dangling bonds are formed previously according to the present aspect, the kinetic energies of the neutral beam are mainly utilized for elimination, thus improving the energy efficiency.

The present invention is highly effective in the preparation of semiconduct, or devices designed on the basis of fine design rule to meet the demands for high integration, high performance and high reliability.

BRIEF DESCRIPTION OF THE DRAWINGS

FIG. 2a shows the status of a wafer prior to etching, FIG. 2b shows the state of a dangling bond just formed on $Ar^+$ beam radiation, FIG. 2c shows the state of an $SiF_x$ layer just formed and FIG. 2d shows the state of the $SiF_x$ layer just eliminated by $Ar^+$ beam irradiation.

FIG. 4a shows the state in which F is just adsorbed to the surface of a single crystal Si substrate and FIG. 4b shows the state in which $SiF_x$ generation and elimination thereof are produced competitively by the neutral Ar beam irradiation.

FIG. 5a shows the state in which F is just adsorbed on the surface of the $SiN_x$ layer, FIG. 5b shows the state in which etching of the $SiN_x$ layer proceeds as a result of supply of $Cl^*$ and radiation of the neutral Ar beam and FIG. 5c shows the state in which etching of the $SiN_x$ layer is just terminated.

FIG. 7a shows the status of a wafer prior to etching, FIG. 7b shows the state of dangling bonds just formed on $Ar^+$ beam irradiation, FIG. 7c shows the state of an $SiF_x$ layer just formed and FIG. 7d shows the state of the $SiF_x$ layer just eliminated by neutral Ar beam irradiation.

DETAILED DESCRIPTION OF THE INVENTION

The present invention is hereinafter explained with reference to non-limiting Examples.

EXAMPLE 1

In the present Example 1, the present invention is applied to etching of a single crystal silicon (Si) substrate aimed at forming fine quantum wires and, after dangling bonds are formed on the substrate surface by an $Ar^+$ beam, $F^*$ radicals are adsorbed to the bond to form an $SiF_x$ layer and the $SiF_x$ layer is then eliminated by irradiation of the $Ar^+$ beam.

Figure 1:
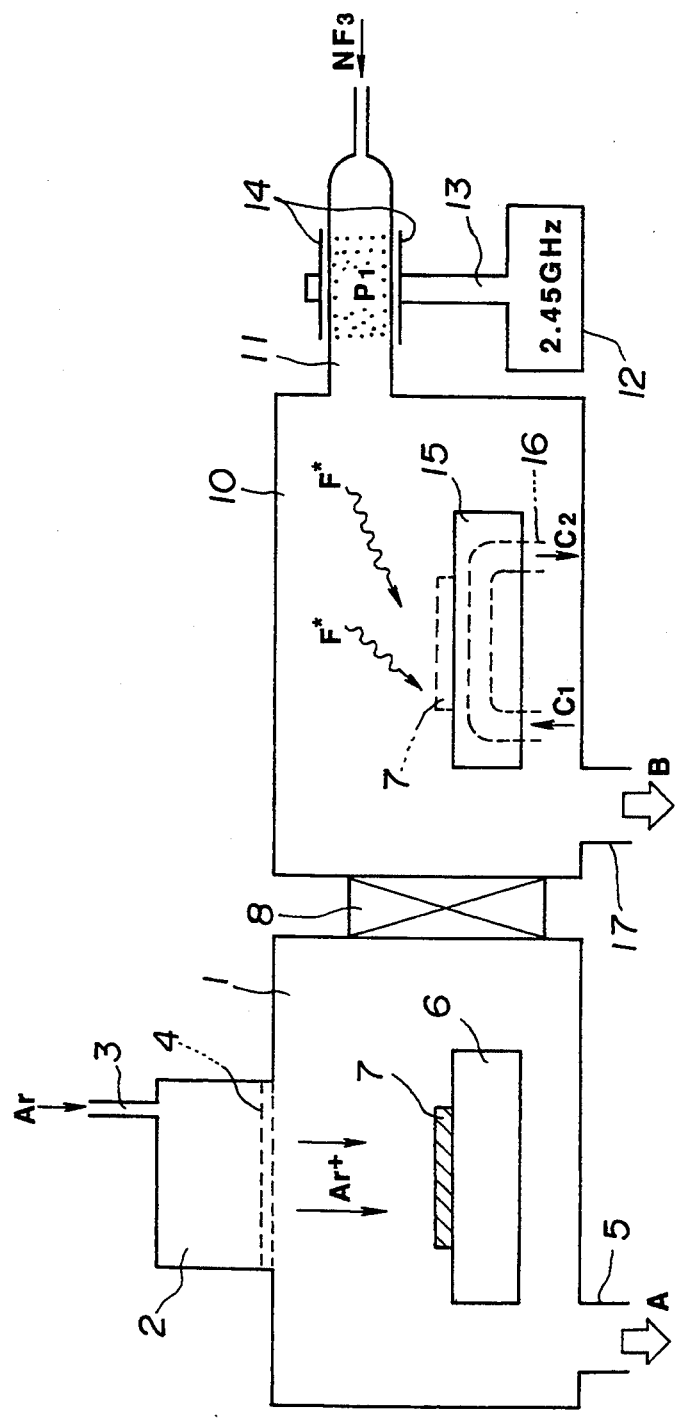
FIG. 1 is a schematic cross-sectional view showing a typical construction of a dry etcher employed in the present invention.

FIG. 1 shows a schematic construction of a dry etcher employed in the present embodiment.

The present etcher is comprised of an ion irradiation chamber 1 used for forming the dangling bonds and eliminating the $SiF_x$ layer, and a microwave discharging type downstream chamber 10, which are interconnected under high vacuum by means of a gate valve 8.

A wafer stage 6 for setting a wafer 7 thereon is contained in the ion radiation chamber 1 which has its interior evacuated to a high vacuum in the direction shown by an arrow A by a vacuum system, not shown, connected to an evacuating port 5. An ion generating chamber 2 is connected to the ion irradiation chamber 1 via a multi-aperture electrode 4. In the ion generating chamber 2, ions are generated from a gas introduced into the chamber 2 via a gas inlet duct 3 as an ion source and are irradiated onto the wafer 7.

A second wafer stage 15 for setting the wafer thereon is similarly contained in the downstream chamber 10 which has its inside evacuated to a high vacuum via an evacuating port 17 in the direction shown by an arrow B. The wafer stage 15 is provided with an enclosed cooling conduit 16 through which a cooling medium is circulated in the directions shown by arrows $C_1$, $C_2$ from an external cooling system, such as a chiller, for cooling the wafer 7.

A microwave discharge tube 11, which is connected to the downstream chamber 10, is sandwiched between a pair of electrodes 14 adapted for generating an electrical field by microwaves supplied via a wave guide 13 from a magnet ton oscillator 12 having an oscillation frequency of 2.45 GHz. A reaction gas introduced into the microwave discharge tube 11 is excited by the microwave to form a plasma $P_1$. Among chemical species generated in the plasma, neutral active species having a longer lifetime are drawn into the downstream chamber 10 so as to be adsorbed onto the wafer 7 maintained at a lower temperature.

A typical etching operation of etching a single crystal Si substrate using the above etcher is explained by referring to FIGS. 2a to 2d, in which the amount of etching along the depth is exaggerated for convenience in the explanation.

Figure 2A:
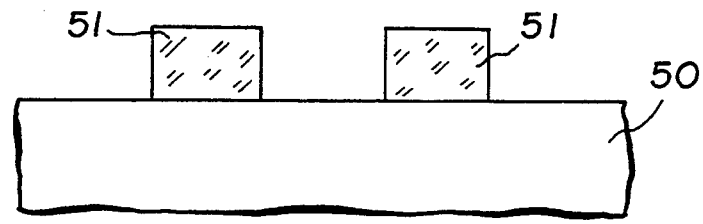
FIGS. 2a to 2d are schematic cross-sectional views showing an example of the present invention as applied to etching of a single crystal Si substrate, step by step, where
Figure 2B:
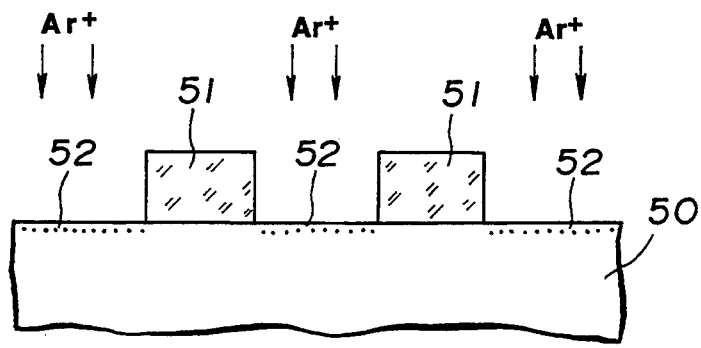

A wafer 7 as an etching sample is shown in FIG. 2a and is composed of a single crystal Si substrate 50 on which a resist mask 51 is formed after a predetermined patterning. This wafer 7 was set on the wafer stage 6 in the ion irradiating chamber 1 and $Ar^+$ were generated in the ion generating chamber 2 by introducing an Ar gas through gas inlet duct 3. These ions were drawn out as a beam via multi-aperture electrode 4 and irradiated on the wafer 7 with an incident energy of approximately 20 eV. In this manner, dangling bonds 52 were produced in areas of the surface of the single crystal Si substrate 50 not covered by the resist mask 51.

Figure 2C:
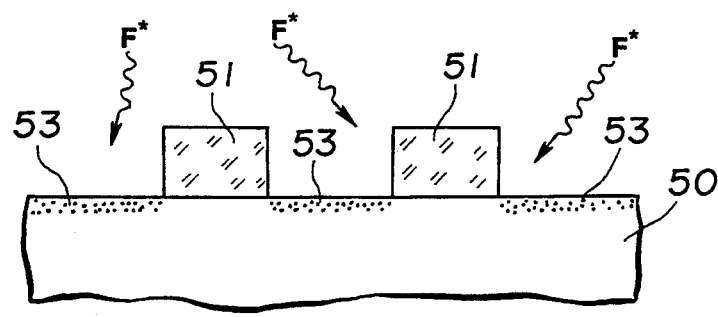

The wafer 7 was transferred into the downstream chamber 10 and set on the wafer stage 15 previously cooled by circulating liquid nitrogen in the cooling conduit 16. $NF_3$ was introduced from one end of the discharge tube 11 at a flow rate of 1000 SCCM and microwave discharge was carried out under conditions of a gas pressure of 133 Pa (1 Torr) and a microwave power of 1 kW (13.56 MHz) to supply $F^*$ generated in the plasma $P_1$ onto the wafer 7. The $F^*$ radicals were bonded to the dangling bonds 52 previously formed on the wafer surface to form an $SiF_x$ layer 53 promptly as shown in FIG. 2c, thus in a manner markedly different from the state in the conventional dry etching in which simply F is adsorbed.

Figure 2D:
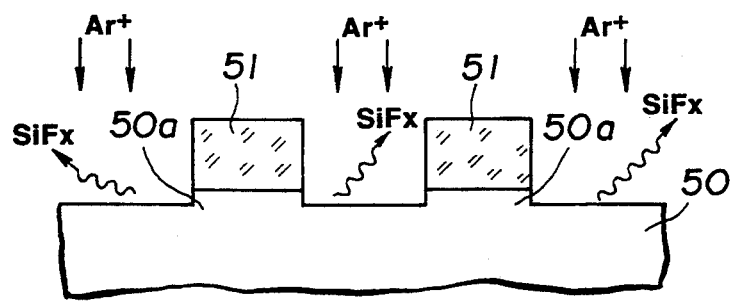

The wafer 7 was again transferred into the ion irradiating chamber 1 and irradiated with the $Ar^+$ beam under the same conditions as described above. By this irradiation, the $SiF_x$ layer 53 was eliminated promptly so that an Si pattern 50a having an anisotropic shape as shown in FIG. 2d was formed. It is noted that the above process cycle of formation of the dangling bonds 52 and the $SiF_x$ layer 53 followed by elimination thereof proceed on the level of the monatomic layer, so that a larger number of the above process cycles will need to be repeated for producing the Si pattern 50a shown in FIG. 2d.

Anisotropic etching is feasible in the present embodiment because formation of the dangling bonds 52 and elimination of the $SiF_x$ layer 53 proceed only on the surface irradiated by the $Ar^+$ beam. Since the dangling bonds 52 are formed in the above process before adsorption of $F^*$ radicals, the etchrate could be doubled as compared to the case of not forming the dangling bonds 52.

EXAMPLE 2

In the present Example 2, the etching method of the present invention is applied to etching of a single crystal Si substrate and a neutral Ar beam is irradiated thereto for forming and eliminating an $SiF_x$ layer.

Figure 3:
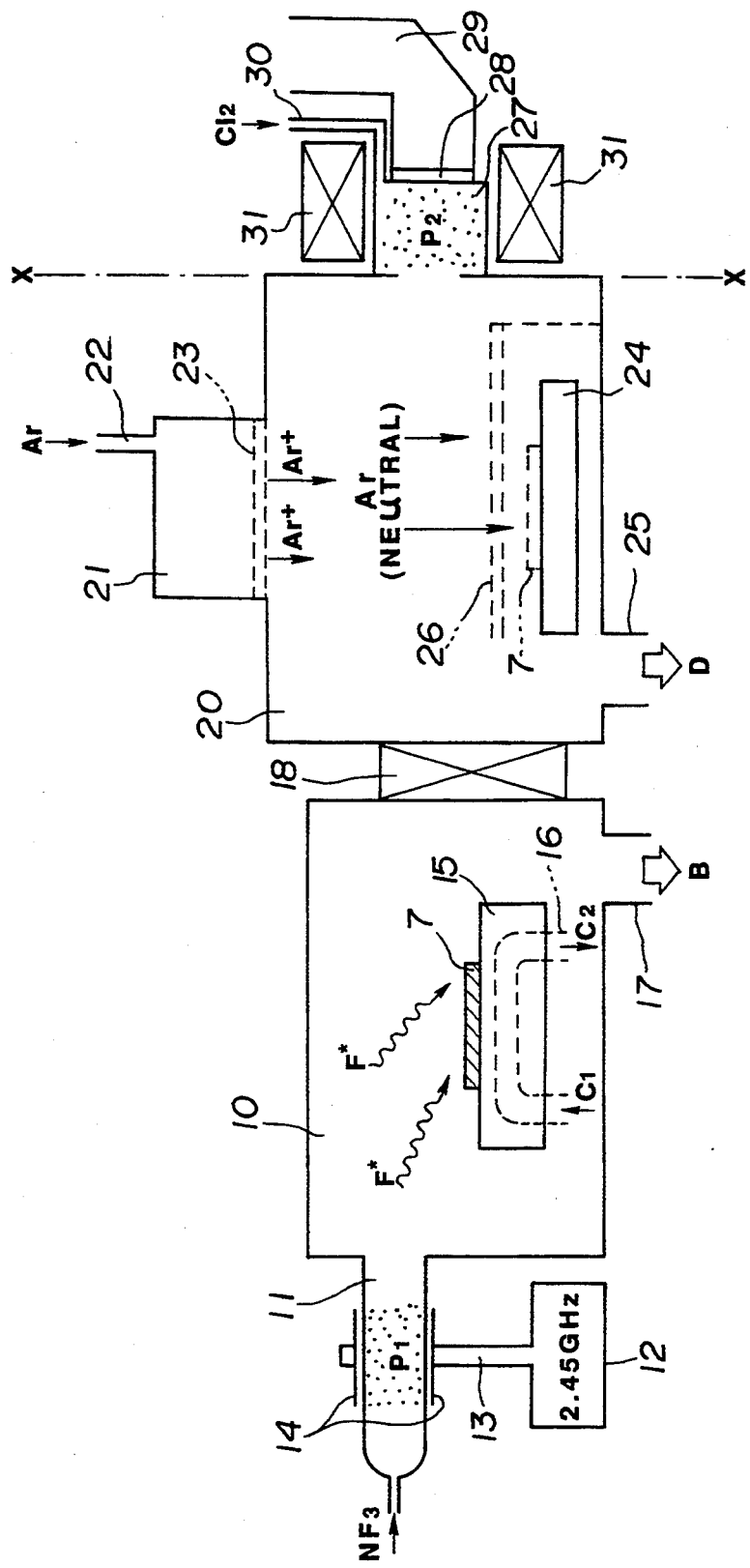
FIG. 3 is a schematic cross-sectional view showing another typical construction of a dry etcher employed in the present invention.

A schematic construction of a dry etcher employed in the present Example is shown in FIG. 3, in which reference numerals are used partially in common with FIG. 1.

The etcher is comprised of a downstream chamber 10 for adsorbing F on the surface of a single crystal Si substrate, and a neutral beam irradiating chamber 20 for irradiating the neutral Ar beam, which chamber are interconnected under high vacuum by a gate valve 18.

The construction of the downstream chamber 10 is similar to that described above and therefore is not explained herein for simplicity.

A wafer stage 24 for setting the wafer thereon is similarly contained in the neutral beam irradiating chamber 20 which has its inside evacuated to a high vacuum via an evacuating port 25 with an aid of a vacuum system, not shown, in the direction shown by an arrow D. An ion generating chamber 21 is connected to the ion irradiation chamber 20 via a multi-aperture electrode 23. In the ion generating chamber 21, ions are generated from a gas introduced into the chamber 21 via a gas inlet duct 22 as an ion source. These ions are drawn into the neutral beam irradiation chamber 20 and neutralized by a charge exchange reaction with a background gas before being incident on the wafer 7 via a charged particle removal electrode 26.

In the neutral beam irradiation chamber 20, an ECR (electron cyclotron resonance) plasma supply section, shown to the right of a line X—X in FIG. 3, is provided for supplying active species into the etching reaction system as the occasion may demand. Reaction gases are introduced into an ECR plasma generating chamber 27 of the ECR plasma supply section, and an ECR discharge is carried out under the effect of a microwave introduced by means of a wave guide 29 and a microwave introducing window 28, and a magnetic field generated by a solenoid coil 31 provided around the chamber 27, for generating a plasma $P_2$.

Figure 4A:
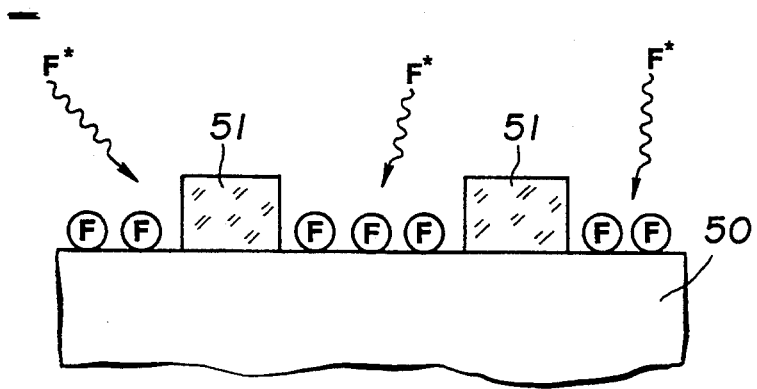
FIGS. 4a and 4b are schematic cross-sectional views showing another example of the present invention as applied to etching of a single crystal Si substrate, step by step, where
Figure 4B:
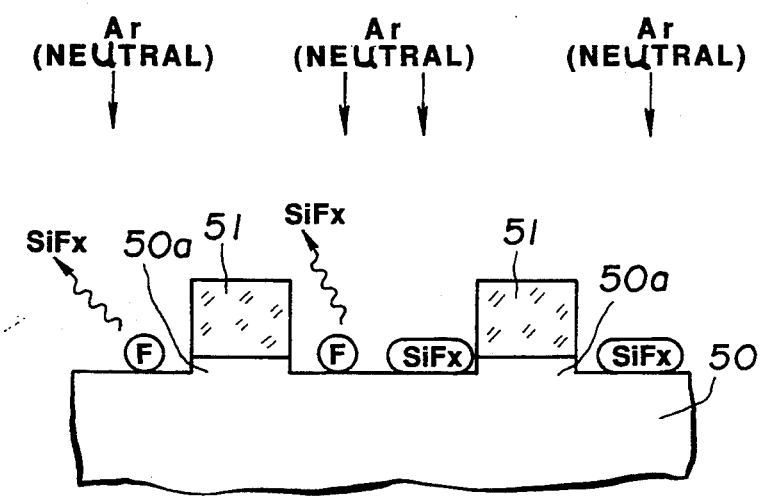

A typical etching operation of etching a single crystal Si substrate is explained by referring to FIGS. 4a and 4b in which reference numerals are used partially in common with those of FIGS. 2a to 2d. In the present Example, the ECR plasma supply section is not in use.

The construction of the wafer 7 as an etching sample is the same as that shown in FIG. 2a. The wafer 7 in this state was set on a wafer stage 15 previously cooled by circulating liquid nitrogen through a cooling conduit 16 in the downstream chamber 10. $NF_3$ was introduced from one end of the microwave discharge tube 11 at a flow rate of 1000 SCCM and microwave discharge was carried out under conditions of a gas pressure of 133 Pa (1 Torr) and a microwave power of 1 kW to supply $F^*$ generated in the plasma $P_1$ to the wafer 7. As a result, F was adsorbed onto the surface of the wafer 7, as shown in FIG. 4a, similarly to the initial state in the conventional dry etching method.

The wafer 7 was transferred into the neutral beam irradiation chamber 20 and set on the wafer stage 24. An Ar gas was introduced from gas inlet duct 22 for generating $Ar^+$ in the ion generating chamber 21. These ions are drawn out as a beam via multi-aperture electrode 23 and converted by charge exchange reaction into a neutral Ar beam which was caused to be incident on the wafer 7 via charged particle removing electrode 26. The kinetic energies of the neutral Ar beam were transferred to F adsorbed on the wafer surface so that an Si pattern 50a exhibiting shape anisotropy could be formed by the process of the formation and elimination of the $SiF_x$ layer, as shown in FIG. 4b. In the conventional dry etching process, since the charged beam (At+ beam) was irradiated at this stage, it was intrinsically difficult to prevent radiation damages. Since the neutral Ar beam is used in the present invention, radiation damages may be prevented.

EXAMPLE 3

In the present Example, the present invention is applied to high selectivity etching of a silicon nitride ($SiN_x$) layer on a silicon oxide ($SiO_2$) layer and, after F is adsorbed onto the surface of the $SiN_x$ layer, etching by Cl-based active species is assisted by a neutral Ar beam.

The etching of the $SiN_x$ layer on the $SiO_2$ layer is etched by typically performed in the patterning for defining an element isolation region by e.g. a LOCOS method. This etching is in need of high underlying layer selectivity under the current status of the art in which a pad oxide ($SiO_2$) layer is formed as a thin film for minimizing a bird's beak length. In forming a contact hole, stacked $SiO_2$—$SiN_x$ layers are laid as an underlying layer for the interlayer insulating film to prevent the substrate from being damaged. In this case, high selectivity etching is similarly required. However, such high selectivity etching has been thought to be difficult because the etchants for the two layers are the same and interatomic bond energy for Si—N is approximate to that for Si—O.

As one of techniques for realizing such high selectivity etching, a process of supplying $NF_3$ and $Cl_2$ to the chemical dry etcher and using FCl generated in a gaseous phase by microwave discharge for etching is reported in Proceedings of Symposium on Dry Process, Vol .8, No.7, p.86 to 94 (1987). However, this process has a drawback that the etching reaction in this process is essentially a reaction by radicals and difficulties are presented in anisotropic etching.

Figure 5A:
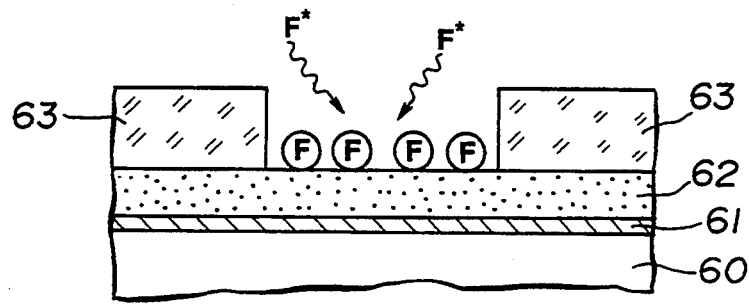
FIGS. 5a to 5c are schematic cross-sectional views showing an example of application of the present invention to high selectivity etching of an $SiN_x$ layer on an $SiO_2$ layer, step by step, where
Figure 5B:
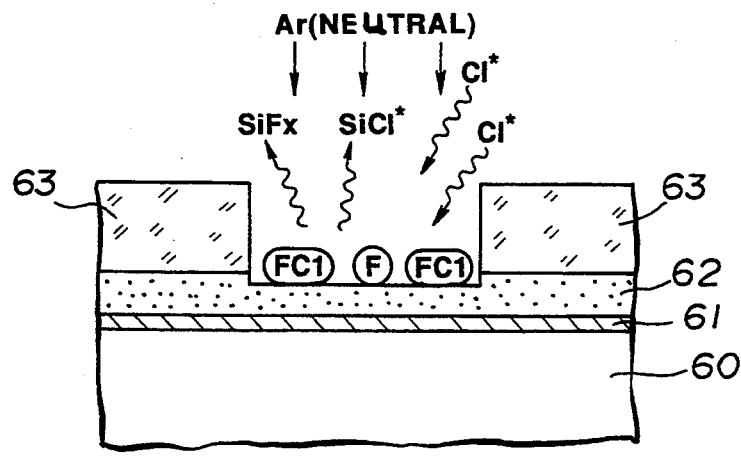
Figure 5C:
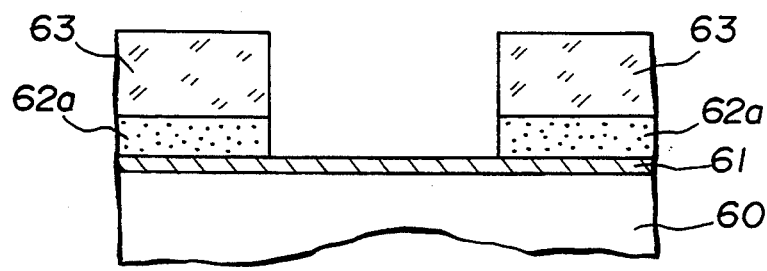

In the following process, anisotropic etching is realized in high selectivity etching of the $SiO_2$ layer and the $SiN_x$ layer. This process is explained by referring to FIGS. 5a to 5c.

The etcher employed in the present Example is that shown in FIG. 3. The ECR plasma supplying section is employed in the present Example.

A wafer 7 composed of a single crystal silicon substrate 60, an $SiO_2$ layer 61 and an $SiN_x$ layer 62 stacked thereon, and a resist mask 63 selectively formed on the $SiN_x$ layer 62, was set on the wafer stage 15 in the downstream chamber 10. In this state, a plasma $P_1$ was generated by discharge of $NF_3$ under the same conditions as above to allow F to be adsorbed on an area of the surface of the $SiN_x$ layer 62 not covered by the resist mask 63.

The wafer 7 was then transferred onto the wafer stage 24 in the neutral beam irradiation chamber 20. In this state, $Cl_2$ was supplied from a gas supply conduit 30 at a flow rate of 100 SCCM and microwave discharge was carried out under the conditions of a gas pressure of 0.13 Pa (10 retort) and a microwave power of 1 kW (13.56 MHz) to generate a plasma $P_2$ in the ECR plasma generating chamber 27. Cl* radicals were drawn from the plasma $P_2$ into the neutral chamber irradiation chamber 20, at the same time that a neutral Ar beam was incident onto the wafer 7. The etching reaction proceeded under a mechanism in which FCl was generated by the reaction of Cl* with previously adsorbed F and reacted with the $SiN_x$ layer 62 under assistance by the neutral Ar beam to generate reaction products $SiF_x$ and $SiCl_x$ which reaction products are eliminated Under the kinetic energies donated by the neutral Ar beam. This reaction process is shown schematically in FIG. 5b.

Etching on the level of the monaromic layer proceeds in this manner with the F adsorption - neutral Ar beam radiation and Cl* supply as one cycle. This cycle is repeated a large number of times to form an $SiN_x$ pattern 62a exhibiting shape anisotropy. Such anisotropic etching becomes possible because generation and elimination of the reaction products proceed only on the incident surface of the directive neutral Ar beam. Since FCl can not become etchant for $SiO_2$, etching was terminated when the surface of the $SiO_2$ layer 61 was exposed, and high selectivity was achieved simultaneously.

Meanwhile, considering the above mentioned reaction mechanism, high selectivity etching may basically be achieved if Cl is adsorbed from the outset on the surface of the $SiN_x$ layer 62 and neutral Ar beam assisted etching is performed while F* are supplied. However, considering the mass difference between F and Cl, it is more advantageous to transport F with a lesser mass in the downstream manner because uniform adsorption may thereby be realized, while it is also more advantageous to supply Cl* with a larger mass because a part of the kinetic energies at the time when the radicals arrive at the wafer surface may be utilized as reaction energies.

EXAMPLE 4

Figure 6:
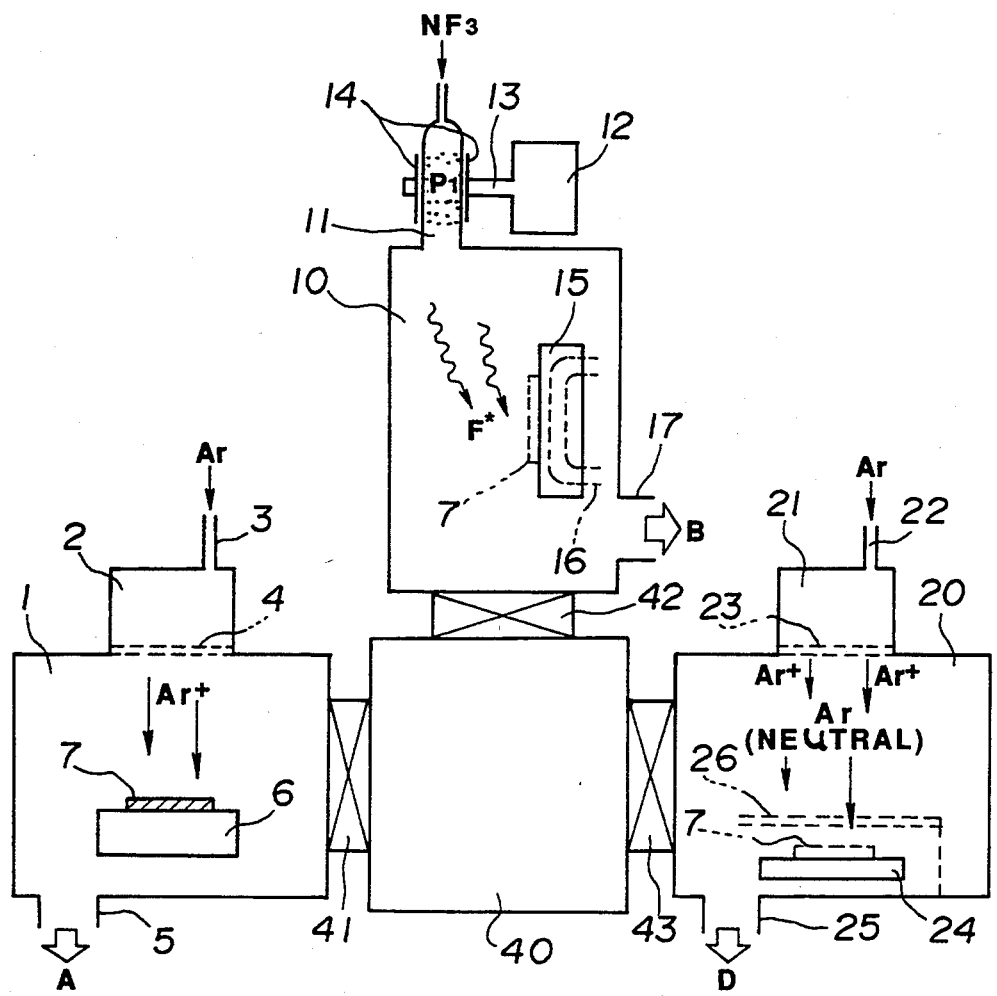
FIG. 6 is a schematic cross-sectional view showing another typical construction of a dry etcher employed in the present invention.

In the present Example 4, the method according to a further aspect of the present invention is applied to etching of a single crystal Si substrate and, after dangling bonds are formed on the substrate surface by the Ar+ beam, F* radicals are adsorbed thereto to form an $SiF_x$ layer, which $SiF_x$ layer was eliminated by irradiating with the neutral Ar beam. FIG. 6 shows a schematic construction of a dry etcher employed in the present embodiment. In FIG. 6, reference numerals are partially in common with those used in FIGS. 1 and 3.

The etcher is a multi-chamber construction in which an ion irradiation chamber 1 used for forming dangling bonds, a downstream chamber 10 utilized for adsorbing F* and forming the $SiF_x$ layer, and a neutral beam irradiation chamber 20, are interconnected via gate valves 41, 42 and 43 to a wafer handling unit 40, respectively. With such a construction, the wafer 7 processed in a predetermined manner in one of the chambers is transferred to another via wafer handling unit 40. It is noted that FIG. 6 schematically shows a planar arrangement of the chambers 1 , 10 and 20 without taking into account the three-dimensional disposition. The chambers 1, 10 and 20 are arranged as described previously.

A typical etching operation of a single crystal Si substrate by the above etcher is explained by referring to FIGS. 7a to 7d., in which the reference numerals are identical with those used in FIGS. 2a to 2d.

Figure 7:
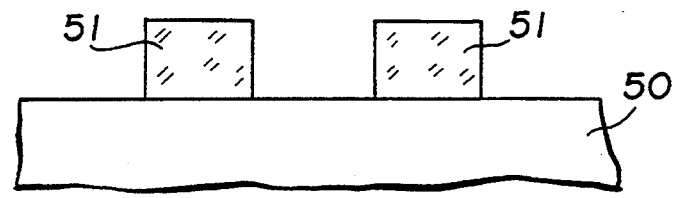
FIGS. 7a to 7d are schematic cross-sectional views showing an example of the present invention as applied to etching of a single crystal Si substrate, step by step, where
Figure 7:
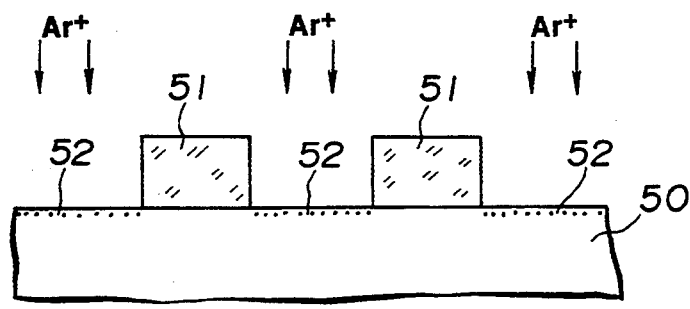
Figure 7:
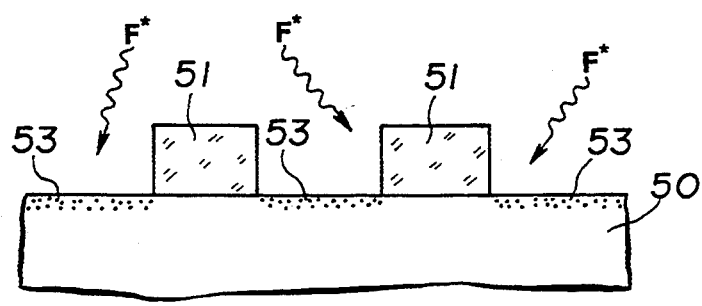
Figure 7:
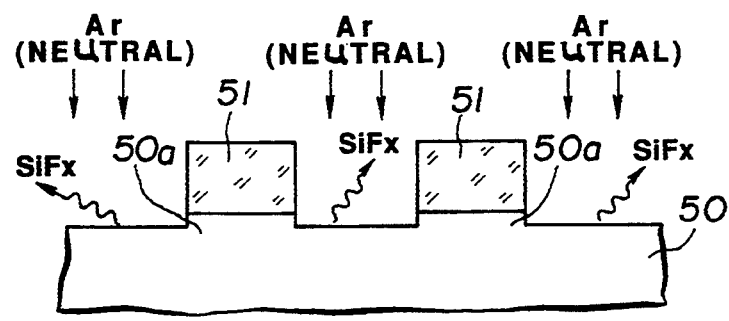

A sample wafer 7 is composed of a single crystal Si substrate 50 on which a resist mask 51 is formed selectively, as shown in FIG. 7a. This wafer 7 was set on the wafer stage 6 in the ion irradiating chamber 1 and an Ar+ beam was irradiated thereto with an ion incident energy of approximately 20 eV. In this manner, dangling bonds 52 were produced on the surface of the single crystal Si substrate 50, as shown in FIG. 7b.

The wafer 7 was then transferred via wafer handling unit 40 onto the cooled wafer stage 15 in the downstream chamber 10 and F* generated by microwave discharge of $NF_3$ were adsorbed thereto. In this manner, the SiF$_x$ layer 53 was formed on the surface of the single crystal Si substrate 50, as shown in FIG. 7c.

The wafer 7 was then transferred via wafer handling unit 40 onto the wafer stage 24 in the neutral beam irradiating chamber 20 and irradiated with a neutral Ar beam. By this irradiation, the SiF$_x$ layer 53 was eliminated and an Si pattern 50a exhibiting shape anisotropy was produced, as shown in FIG. 7d.

With the present embodiment, the etchrate was almost doubled by the formation of dangling bonds 52, while low damages were achieved by using the neutral beam for eliminating the SiF$_x$ layer 53.

The present invention is not limited to the above explained four embodiments. For example, light exposure may simultaneously be employed for eliminating reaction products, such as SiF$_x$ or SiCl$_x$. The energies of the light at this time are utilized for heating, so that, in distinction from the case of photo-etching, it is unnecessary to limit the light wavelengths in consideration of the maximum absorption of the reaction gases.

There is no necessity of limiting the wafer cooling temperature to that described above on the condition that the temperature is such that the reaction products are not vaporized off and the conditions of elimination rate determination are satisfied. Since however excess cooling leads to lowered reaction rates, it is necessary to control the temperature depending on the type of the reaction systems.

There is also no 1 imitation to the gas pressure on the condition that it is low enough to inhibit scattering or recombination of neutral active species.

What is claimed is:

1. A dry etching process comprising
   (a) a step of forming dangling bonds on the surface of a sample wafer by irradiating with an Ar$^+$ beam, then
   (b) a step a cooling said sample wafer and causing etchants to be adsorbed thereto to form a surface reaction layer, and
   (c) a step of irradiating said wafer with a neutral beam for eliminating said surface reaction layer, said steps (a) to (c) being repeated sequentially.

2. A dry etching method as claimed in claim 1 wherein said neutral beam is a neutral Ar beam.

* * * * *